United States Patent [19]

Devito

[11] Patent Number: 4,839,653
[45] Date of Patent: Jun. 13, 1989

[54] HIGH-SPEED VOLTAGE-TO-FREQUENCY CONVERTER

[75] Inventor: Lawrence M. Devito, Tewksbury, Mass.

[73] Assignee: Analog Devices Incorporated, Norwood, Mass.

[21] Appl. No.: 56,455

[22] Filed: May 29, 1987

[51] Int. Cl.⁴ .................................... H03K 13/17
[52] U.S. Cl. .................... 341/157; 341/159
[58] Field of Search ............ 340/347 AD; 332/1, 9 R; 341/157–159

[56] References Cited

U.S. PATENT DOCUMENTS

| | | | |
|---|---|---|---|
| 3,675,238 | 7/1972 | Butsher | 340/347 AD |
| 3,877,020 | 4/1975 | Brunstone et al. | 341/157 |
| 4,118,696 | 10/1978 | Warther | 341/157 |
| 4,270,118 | 5/1981 | Brokaw | 341/159 |
| 4,471,340 | 9/1984 | Lewis | 340/347 AD |
| 4,521,763 | 6/1985 | Murao et al. | 341/157 |

Primary Examiner—Vit W. Miska
Attorney, Agent, or Firm—Parmelee, Bollinger & Bramblett

[57] ABSTRACT

A voltage-to-frequency converter comprising a triwave generator responsive to an input signal to produce an output triangular signal the frequency of which corresponds to the magnitude of the input signal, and a voltage-slope-to-periodic-function (VSTPF) generator which receives the output of the triwave generator and produces a pulsed output signal having a frequency which is a multiple of that of the triwave generator.

10 Claims, 3 Drawing Sheets

HIGH-SPEED VOLTAGE-TO-FREQUENCY CONVERTER

BACKGROUND OF THE INVENTION

1. Field of the Invention

This invention relates to analog-to-digital (A/D) converters. More particularly, this invention relates to A/D converters of the voltage-to-frequency type, commonly designated VFC in this art.

2. Description of the Prior Art

A voltage-to-frequency converter typically produces a train of pulses having a frequency which is proportional to an applied input signal. The speed of a VFC is an important characteristic, and is reflected by the full-scale frequency of the device. Very high speed VFCs (e.g. 20 MHz full scale) are available in modular form, but are quite costly to manufacture. Much less costly VFCs are available in integrated-circuit (IC) form, but have limited speed, e.g. full-scale frequency of 1 MHz.

SUMMARY OF THE INVENTION

In a preferred embodiment of the invention, to be described hereinbelow in detail, there is provided a voltage-to-frequency converter designed for IC application, and having a full-scale output frequency of 30 MHz. Such high speed operation is made possible by the novel architecture of the converter which comprises two cascaded components which are individually known per se. The first component is a triangular-wave VFC (referred to in short as a triwave VFC), and the second component is a device referred to herein as a voltage-slope-to-periodic-function converter (shortened to VSTPF). A conventional triwave converter may have a nominal full-scale output frequency of, say, 1 MHz. That output signal frequency is effectively multiplied by the VSTPF to produce a final full-scale output frequency which might, for example, be in the range of 30 MHz.

The speed of response of a triwave VFC is limited effectively to the period of one cycle. That is, when the input signal changes, that fact is not evidenced in the triwave output frequency until one complete cyclic interval (i.e. one up-and-back variation) of the triwave signal is traversed. However, the triwave output signal actually shows the effect of the changed input signal essentially immediately, because the slope of the triwave output signal is correspondingly altered when the input signal changes. In accordance with the present invention, the changed output signal slope is sensed promptly by the voltage-slope-to-periodic-function converter coupled to the output of the triwave VFC, and is evidenced with very little time delay by a corresponding change in the pulse repetition frequency of its output pulse train. In effect, the VSTPF device extracts advance information from the ramp rate of the triwave output signal. Consequently, the overall speed of operation of the VFC is greatly increased.

Other objects, aspects and advantages of the invention will be pointed out in, or apparent from, the following detailed description of a preferred embodiment of the invention, considered together with the accompanying drawings.

DESCRIPTION OF A PREFERRED EMBODIMENT

Figure 1:
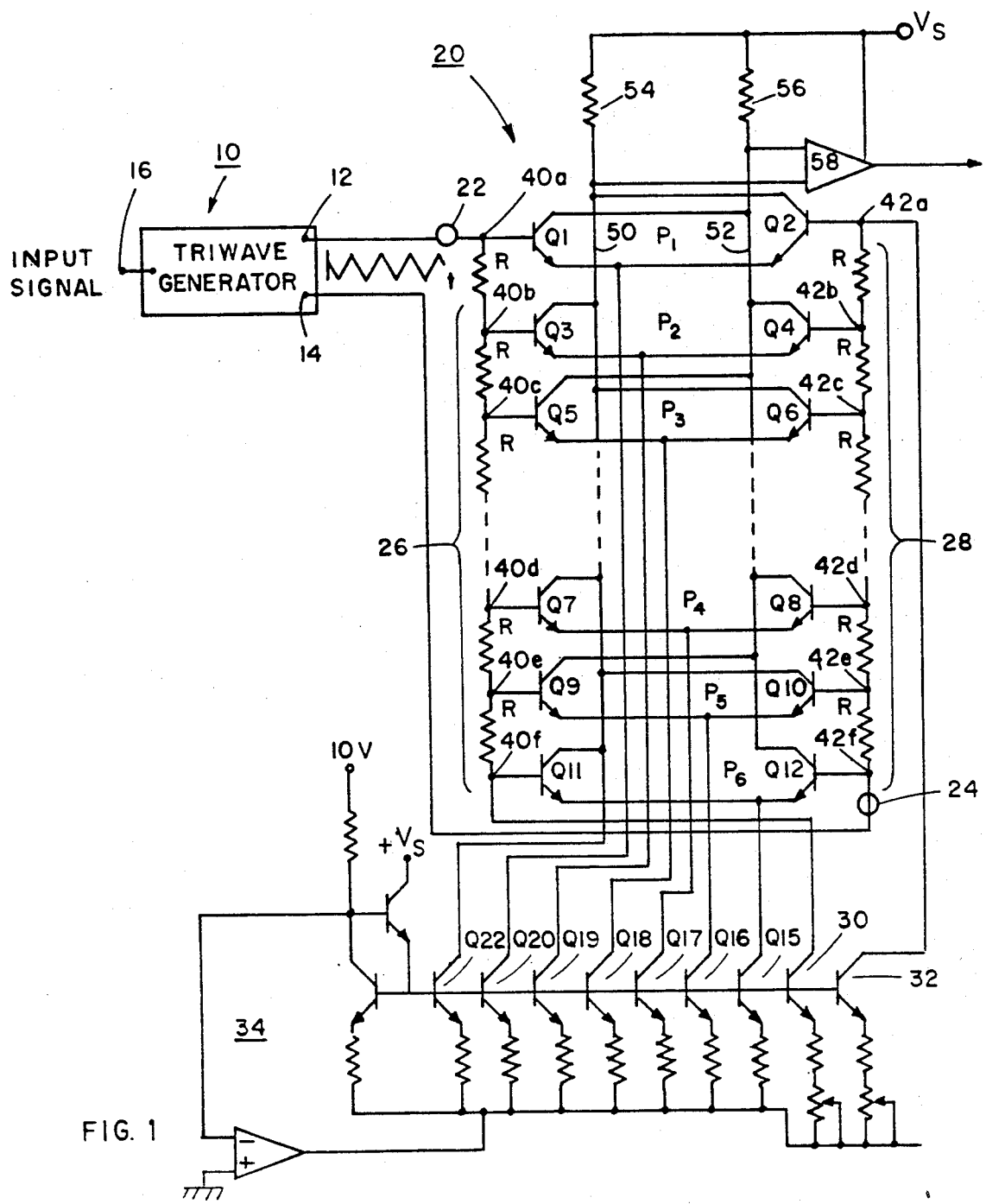
FIG. 1 is a schematic diagram illustrating a presently preferred embodiment of the invention.

Referring now to FIG. 1, the preferred embodiment comprises as its first component a triangular-wave (triwave) generator 10 which can be of conventional design arranged to produce between a pair of output terminals 12, 14 an output voltage which varies in a triangular fashion, i.e. with linearly-varying segments with fixed upper and lower limits as illustrated by the graph on FIG. 1 adjacent the output terminals. The slope of the segments, and thus the frequency of the output signal, is proportional to the magnitude of the input signal applied to input terminal 16. The output frequency may, for example, have a full-scale value of one MHz.

This triangular wave output signal is directed to the second component 20 of the converter, comprising a device for producing a serial sequence of periodic output pulses in response to a linearly-changing input signal. Although such devices are known per se, there does not seem to be any commonly accepted name for identifying the devices generically. Accordingly, for purposes of this patent application, such a device (as will be described in more detail below) will be referred to as a "voltage-slope-to-periodic-function" converter, or for brevity, a VSTPF converter.

One such VSTPF converter is described in detail in U.S. Pat. No. 4,270,118, where it is arranged as part of a parallel analog-to-digital converter. The circuitry shown in that patent is quite similar to the VSTPF converter 20 disclosed herein as part of the preferred embodiment of this invention, and thus reference to that patent may be made for additional related information.

The VSTPF device shown in the above '118 patent can be viewed as a stack of comparators with different threshold points distributed evenly throughout a prescribed input voltage span of its voltage input signal. The converter 20 herein differs from that shown in the '118 patent in that it employs a balanced differential circuit rather than a single-sided circuit. This difference however is not fundamental to the present invention. For information regarding still another type of VSTPF converter, reference may be made to U.S. Pat. No. 4,596,976.

Turning now to the VSTPF converter 20 in more detail, the output signal from the triwave generator terminals 12, 14 is applied to a corresponding pair of input terminals 22, 24. These input terminals in turn are connected to the ends of respective and identical strings of resistors R generally indicated at 26, 28. To simplify the drawings, the resistor strings are each shown with only five resistors R, but it will be understood that a greater number of resistors will normally be employed in each string, for example, thirty or so.

The remote (lower) end of the left-hand resistor string 26 is connected to a current sink in the form of a transistor 30 having an adjustable emitter resistor to set the current flowing through the resistors R of the string 26 to an appropriate level. Similarly, the upper end of the right-hand resistor string 28 is connected to another current-sink transistor 32. Both transistors 30, 32 are base-biased by a reference circuit generally indicated at 34.

The currents flowing through the two resistor strings 26, 28 are set to the same level, and develop corresponding voltage drops across the resistors R. This establishes predetermined voltage differentials between the resistor nodal points 40a,b etc., and 42a,b, etc., at the ends of the resistors.

It will be noted that the current in the left-hand resistor string flows in a down direction, while the current in the right-hand string flows upwards. Thus, the nodal voltages going down through the left-hand string from the input terminal 22 at the upper end of the string are progressively less than the input terminal voltage, and similarly the nodal voltages going up through the right-hand string from the input terminal 24 at the lower end of the string are progressively less than the input terminal voltage.

Connected to each pair of left/right nodal points 40a, 42a; 40b, 42b; etc., are the respective bases of a corresponding pair of differentially-connected transistors $Q_1$, $Q_2$; ... $Q_{11}$, $Q_{12}$. The emitters of these transistor pairs are connected in common to respective current sinks $Q_{15}$–$Q_{20}$ to set the current through each pair. The transistor pairs serve as comparators, with the current from the corresponding sink toggling between the two transistors in accordance with the relative voltages on the bases.

The collectors of these transistors $Q_1$, $Q_2$, etc., are connected to a pair of common output leads 50, 52 respectively. However, the connection pattern reverses as one progresses down through the stack of comparators. That is, in the first comparator $Q_1$, $Q_2$, the collector of the left-hand transistor $Q_1$ is connected to the right-hand output lead 52, and the collector of the right-hand transistor $Q_2$ is connected to the left-hand output lead 50; in the next comparator $Q_3$, $Q_4$, the collector connections are reversed, so that the collector of the left-hand transistor $Q_3$ is connected to the left-hand output lead 50, ad the collector of the right-hand transistor $Q_4$ is connected to the right-hand output lead 52. The collectors connection of the third comparator $Q_5$, $Q_6$ are again reversed, relative to comparator $Q_3$, $Q_4$, and thus are parallel coupled (i.e. coupled in the same fashion) to the output leads relative to the first comparator transistor pair $Q_1$, $Q_2$. Such alternating reversal of collector coupling to the output levels 50, 52 occurs through the entire set of transistor pair comparators.

It thus can be seen that the first, third and fifth differential transistor pairs $P_1$, $P_3$ and $P_5$ make up a first set of transistor pairs associated with a first set of non-successive nodal point pairs 40a, 42a; 40c, 42c; and 40e, 42e. The transistors in all of these pairs are collector coupled in the same fashion to the output leads 50, 52. The remaining differential transistor pairs $P_2$, $P_4$ and $P_6$ make up a second set of transistor pairs associated with a second set of non-successive nodal point pairs 40b, 42b, 40d, 42d; 40f, 42f. The transistors in this second set of pairs are collector coupled in the same fashion to the output leads 50, 52, but reversely coupled relative to the transistor pairs in the first set.

The current drawn through the six differential pairs $P_1$–$P_6$ passes through one or the other of two resistors 54 and 56 in series with the output leads 50 and 52. An additional base-biased current sink transistor $Q_{22}$ is connected to the left-hand output lead 50 to provide an offset bias current.

The total current drawn through each transistor pair is constant. However, this current passes through one or the other transistor in each pair, as determined by the level of the input signals applied to the bases of the transistors by the resistor string nodal points 40a, 42a; etc. This in turn determines whether the current from the respective transistor pairs $P_1$–$P_6$ flows through resistor 54 or resistor 56 in the output leads 50, 52.

In more detail now, for transistor pairs in the first set (as defined above), when the input voltage at the base of the left-hand transistor is less than the voltage at the right-hand base, the right-hand transistor of that pair will conduct more than the left-hand transistor, thereby drawing current from node 50 tending to create a voltage drop across resistor 54. As the left-hand base voltage increases to a value greater than the right-hand base voltage, the left-hand transistor will conduct, thus drawing current through the load resistor 56, and increasing the voltage across resistor 56 relative to the voltage across resistor 54. The transistor pairs in the second set function in the same fashion, except that their connections to the output leads 50 and 52 are reversed relative to the first set of transistor pairs.

In considering the operation of the circuit, it is assumed that each differential transistor pair switches quickly as one base voltage passes the other base voltage. That is, substantially all of the current drawn through each transistor pair passes through one or the other of the two transistors. It also is assumed that the differences in resistor nodal voltages is sufficiently great so that the base voltages applied to the transistors of one pair do not substantially affect the current division in adjacent pairs. Deviations from these assumptions can be accounted for in a manner known to those skilled in this art.

Assume as an initial condition of operation that the triwave output voltage from terminals 12, 14 is at its lowest level, such that the potential of input terminal 22 is substantially less than that of the other input terminal 24. At this limiting condition, the left-hand bases of all of the comparators $P_1$–$P_6$ will be lower in potential than the right-hand bases. Thus, the comparator currents flow through the right-hand transistor in each case.

Since alternate comparators are reversely coupled to the output leads 50, 52, the total sum of the comparator currents will be divided equally between the load resistors 54, 56. However, there will be a net unbalance in current through the load resistors due to the current flowing from the offset bias sink $Q_{22}$ (which has a current level the same as the other comparator sinks). As a result of this unbalance, the output signal from the amplifier 58 will in this initial condition be at a low level, as shown at 60 in the graph of FIG. 2.

As the triwave output signal increases from its initial low level, the potentials of the left-hand bases (transistors $Q_1$, $Q_3$, etc.) will be increased relative to those of the right-hand bases ($Q_2$, $Q_4$, etc.). Due to the voltage drops across the resistors R, the comparators $P_1$, $P_2$, etc., will be toggled in progression from their initial condition, with the right-hand transistor conducting, to their alternate condition with their left-hand transistor conducting. When the first comparator $P_1$ toggles, its current switches from output lead 50 to the other output lead 52, thus increasing the current (by one unit) through load resistor 56 and reducing the current (by one unit) through the other load resistor 54. This produces a corresponding shift in the net output signal, as indicated by the pulse 62 in FIG. 2.

As the triwave output increases still further, the next comparator P₂ toggles, so that its current is transferred from the right-hand load resistor 56 to the left-hand load resistor 54. This restores the relative current balance between the two load resistors which existed at the initial condition discussed above. Accordingly, the output signal reverts to its initial low level, as illustrated at 64 in FIG. 2.

Figure 2:
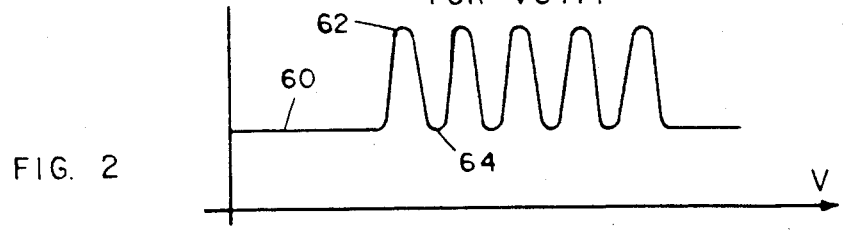
FIG. 2 is a pictorial presentation showing the output of the voltage-slope-to-periodic-function converter plotted against input voltage.

As the triwave signal continues it linear sweep upwards to its upper limit, the remaining comparators P₃ etc., are toggled, switching their currents from one to the other of the two load resistors. The result is to develop a series of periodic output pulses as illustrated in FIG. 2, with the number of pulses being determined by the number of comparators in the circuit. This generation of pulses effectively multiplies the triwave output frequency by the number of pulses developed during a full-scale swing of the triwave output voltage.

The voltage-slope-to-periodic-function (VSTPF) generator 20 employed in the preferred embodiment can be seen to be a set of comparators with their threshold points spaced equally throughout the voltage span of the triwave generator 10. Thus the VSTPF subdivides the span of the triwave into a number of equal voltage intervals. The slope (ramp rate) of the triwave is proportional to the input signal, so that the time spent by the triwave signal in any of the subdivided voltage intervals will be inversely proportional to the input signal. Accordingly, the final output pulse frequency will be proportional to the input signal, with the frequency multiplication being determined by the total number of subdivided voltage intervals.

This technique extracts information from the slope (ramp rate) of the triwave output signal, information which ordinarily would be discarded. The slope of the triwave signal is decoded by the VSTPF generator 20, so that the fact that a change in input signal has occurred becomes available much more quickly than in a conventional converter. That is, this decoding of the slope information provides a faster response time.

Figure 3:
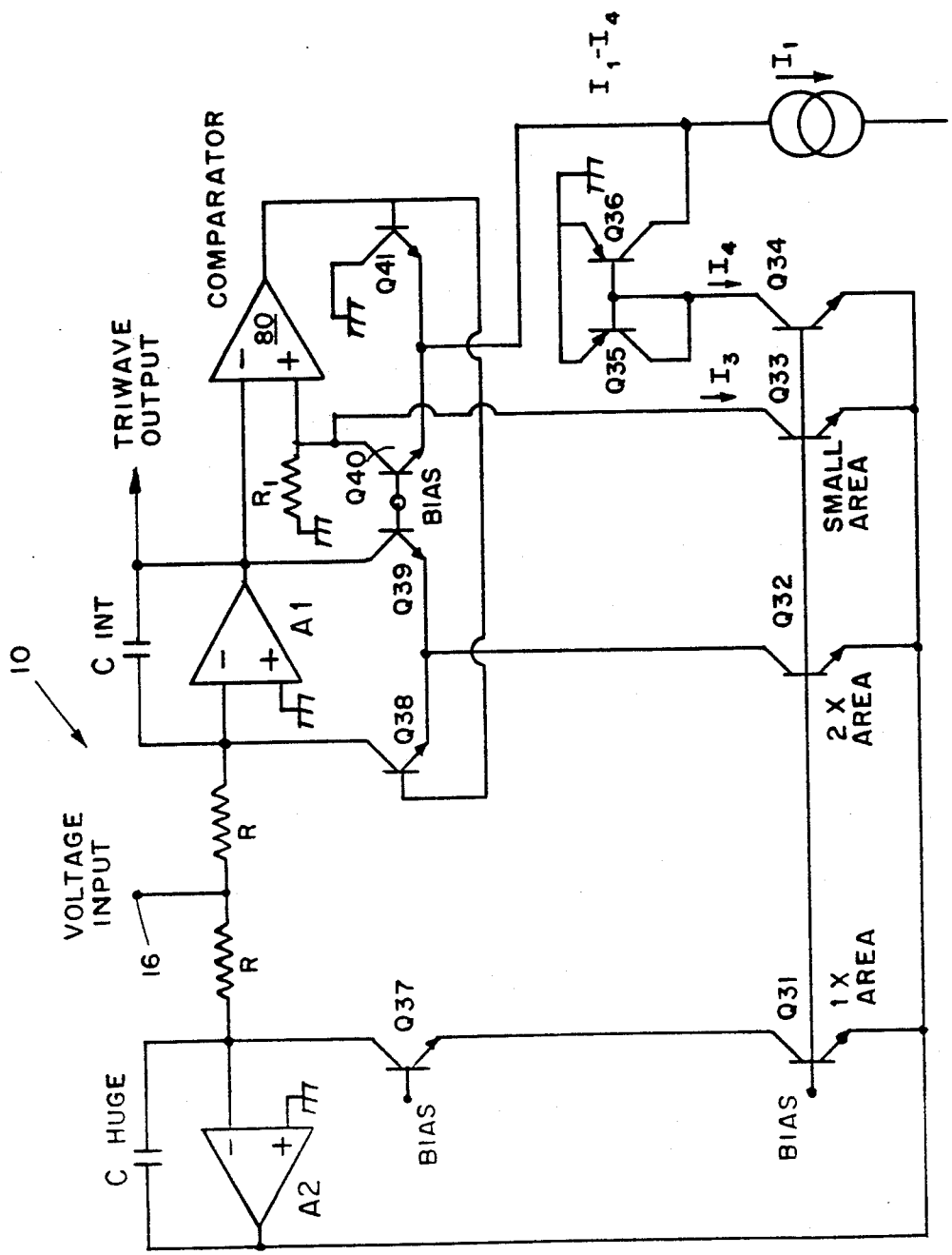
FIG. 3 is a schematic diagram showing details of a triwave generator with compensation circuitry.

Referring now to FIG. 3, there is shown a triwave generator 10 which is of a basically known configuration. The input signal at terminal 16 is applied to two resistors R leading to the inverting inputs of respective amplifiers A1 and A2. The right-hand amplifier A1 is connected with an integrating feedback capacitor $C_{INT}$ so that the amplifier output will have a voltage slope characteristic responsive to the current delivered by the resistor R.

The other amplifier A2 is provided with a very large feedback capacitor, serving to filter noise. The current from the input resistor R is directed through transistors Q37 and Q31 with the base and emitter of the latter connected to the corresponding electrodes of another transistor Q32. Transistors Q31 and Q32 have effective areas in the ratio of 1:2, so that transistor Q32 is a current source carrying a current twice that of the currents through the input resistors R.

Transistors Q38–Q41 form a switch circuit controlled by a comparator 80 which receives the output of the amplifier A1. The comparator threshold is controlled by the voltage drop through an input resistor R1. One component of the current through this resistor is switched on (or off) by transistor Q40 acting under control of the comparator 80, thereby controlling the basic threshold levels of the comparator so as to produce the triwave voltage swings. Another component of current (I₃) through resistor R1 is developed by a current source transistor Q33 to provide compensation as will be explained.

Figure 4:
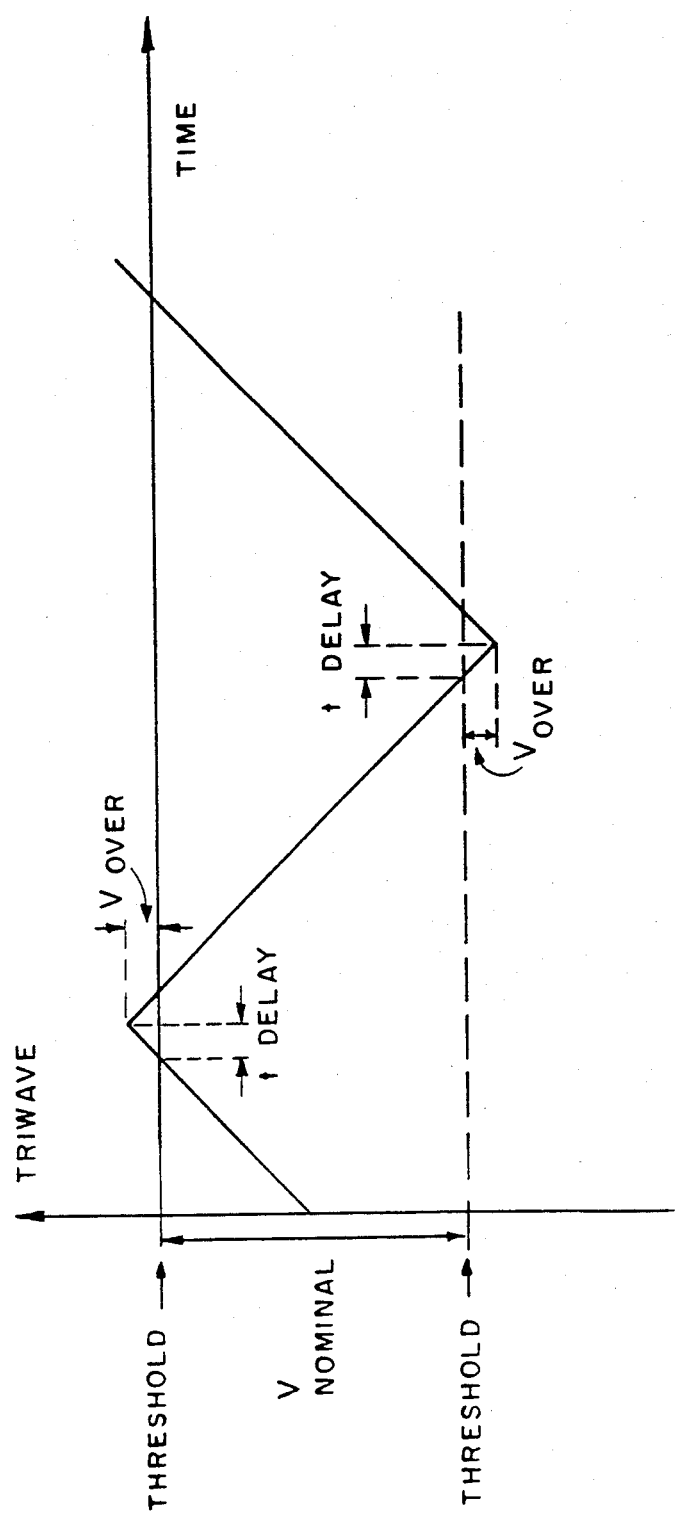
FIG. 4 is a graph to assist in explaining the operation of the circuit of FIG. 3.

Transistors Q38 and Q39 alternately switch the current source Q32 between the inverting input and the output of the amplifier A1, as the comparator 80 triggers at the end of the upsweep and downsweep of the voltage output of amplifier A1. This is graphically indicated in FIG. 4. The frequency of operation is expressed by:

$$f = \frac{I_{IN}}{2 \times C_{int} \times V_{nom}}$$

where $I_{IN}$ is the current (proportional to input voltage) which charges the integrator capacitor $C_{int}$ As shown in FIG. 4, the output voltage of the amplifier A1 tends to overshoot the threshold levels, in both directions, due to switching delay in the comparator. This is indicated at $V_{OVER}$, and normally results in non-linear performance of the triwave generator. The non-linearity effects of such switching delay are, however, compensated for in the circuit of FIG. 3 by modifying the threshold voltages.

For this purpose, currents I₃ and I₄ are generated proportional to the charging current $I_{IN}$. The current I₃ causes the upper threshold to be at a potential of R1×I₃ below ground. By making this new threshold equal in magnitude to the overshoot, $V_{OVER}$, the triwave signal will peak at ground potential, as intended. The lower threshold is modified by both I₃ and I₄, and is at a potential of R1×(I₁−I₄+I₃) below ground. By making I₄ twice as large as I₃, the same correction ($V_{OVER}$) will be developed for the lower threshold as for the upper threshold.

It will be seen that the compensation technique described not only minimizes the non-linearity effects of comparator delay, but in addition tends to hold the amplitude of the triwave signal substantially constant, particularly by maintaining the amplitude independent of ramp rate, and thus independent of the applied input signal. This makes it possible to more precisely match the amplitude of the triwave to the peak-to-peak input range of the VSTPF generator 20. Without such precise matching, the performance will suffer.

For example, if the triwave amplitude is too small, then not all of the periodic pulses (illustrated in FIG. 2) will be exercised, and the output frequency multiplication factor will be less than the correct value. Alternatively, if the triwave amplitude is too large, then there will be idle time near the peaks of the triwave, and the pulses will be crowded together near the center of the slopes. This constitutes a form of frequency modulation, resulting in an output signal with correct average frequency, but with potentially harmful phase jitter. Such adverse effects are, however, significantly minimized by employing means to maintain a constant triwave amplitude, as described.

Although a specific preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. A voltage-to-frequency converter comprising:

a triwave generator responsive to an input signal and operable to produce an output triangular wave having a frequency corresponding to the magnitude of said input signal; and a voltage-slope-to-periodic-function (VSTPF) generator coupled to the output of said triwave generator to produce a pulsed output signal with a frequency which is a multiple of that of said triwave generator.

2. Apparatus as in claim 1, wherein said VSTPF generator comprises a multi-threshold input circuit.

3. Apparatus as in claim 2, wherein said VSTPF generator comprises a set of comparators having progressively different threshold levels.

4. Apparatus as in claim 3, wherein said VSTPF generator comprises a plurality of transistor pairs;

a pair of output lines;

means connecting the outputs of one transistor of each pair to one of said output lines, and connecting the outputs of the other transistor of each pair to the other output line; and threshold means for establishing different threshold levels for each of said transistor pairs, whereby the transistor pairs toggle from one transistor to the other as the input signal varies through a given range.

5. Apparatus as in claim 4, wherein said threshold means comprises a resistor string supplied with current.

6. Apparatus as in claim 1, wherein said triwave generator comprises an integrator receiving the input signal;

a comparator coupled to the output of said integrator to trigger at controlled threshold levels;

switch means controlled by said comparator to switch between first and second conditions upon said comparator reaching said controlled threshold levels; and means operable by said switch means to cause said integrator to ramp up and back between said threshold levels.

7. Apparatus as in claim 6, including compensating means to modify said threshold levels to minimize non-linearity effects caused by switching delay in said comparator.

8. Apparatus as in claim 7, wherein said compensating means comprises a resistor in the input circuit of said comparator; and means responsive to said switch means for developing currents in said input resistor so as to modify both the upper and lower thresholds to avoid the effects of overshoot.

9. Apparatus as in claim 1, including means operable to control said triwave generator to maintain the triwave amplitude substantially constant.

10. Apparatus as in claim 9, wherein said control means includes means responsive to the magnitude of the input signal to maintain said triwave substantially invariant with respect to changes in input signal.

* * * * *